United States Patent
Wu et al.

(10) Patent No.: US 6,913,993 B2
(45) Date of Patent: Jul. 5, 2005

(54) CHEMICAL-MECHANICAL POLISHING METHOD

(75) Inventors: Kun-Lin Wu, Taichung (TW); Meng-Jin Tsai, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 258 days.

(21) Appl. No.: 09/990,948

(22) Filed: Nov. 20, 2001

(65) Prior Publication Data

US 2002/0052117 A1 May 2, 2002

Related U.S. Application Data

(63) Continuation of application No. 09/563,030, filed on May 1, 2000, now abandoned, which is a continuation of application No. 09/132,876, filed on Aug. 11, 1998, now Pat. No. 6,077,784.

(30) Foreign Application Priority Data

Jun. 30, 1998 (TW) ........................................ 87110514 A

(51) Int. Cl.$^7$ .......................................... H01L 21/4763
(52) U.S. Cl. .................... 438/634; 438/624; 438/638; 438/637; 438/738; 438/783; 438/694; 438/695; 438/697; 438/699; 438/756; 438/780
(58) Field of Search ................................ 438/634, 624, 438/638, 637, 738, 783, 694, 695, 697, 699, 756, 780

(56) References Cited

U.S. PATENT DOCUMENTS

| | | | | |
|---|---|---|---|---|
| 5,328,553 A | * | 7/1994 | Poon | 438/633 |
| 5,340,754 A | * | 8/1994 | Witek et al. | 438/156 |
| 5,452,178 A | * | 9/1995 | Emesh et al. | 361/303 |
| 5,494,854 A | * | 2/1996 | Jain | 438/692 |
| 5,506,177 A | | 4/1996 | Kishimoto et al. | |
| 5,658,806 A | | 8/1997 | Lin et al. | |
| 5,789,320 A | * | 8/1998 | Andricacos et al. | 438/678 |
| 5,798,283 A | | 8/1998 | Montague et al. | |
| 5,798,299 A | | 8/1998 | Chung | |
| 5,851,603 A | | 12/1998 | Tsai et al. | |
| 5,913,712 A | * | 6/1999 | Molinar | 451/41 |
| 5,942,801 A | | 8/1999 | Tran | |

(Continued)

FOREIGN PATENT DOCUMENTS

| | | |
|---|---|---|
| JP | 8-037187 | 5/1995 |
| JP | 9-82800 | 3/1997 |
| JP | 10-56009 | 2/1998 |
| JP | 10-173049 | 6/1998 |

*Primary Examiner*—Matthew Smith
*Assistant Examiner*—Victor V Yevsikov
(74) *Attorney, Agent, or Firm*—William J. Kubida; Peter J. Meza; Hogan & Hartson LLP

(57) ABSTRACT

A chemical-mechanical polishing process for forming a metallic interconnect includes the steps of providing a semiconductor substrate having a first metallic line thereon, and then forming a dielectric layer over the substrate and the first metallic line. Next, a chemical-mechanical polishing method is used to polish the surface of the dielectric layer. Thereafter, a thin cap layer is formed over the polished dielectric layer. The thin cap layer having a thickness of between 1000–3000 Å can be, for example, a silicon dioxide layer, a phosphosilicate glass layer or a silicon-rich oxide layer. The method of forming the cap layer includes depositing silicon oxide using a chemical vapor deposition method with silicane ($SiH_4$) or tetra-ethyl-ortho-silicate (TEOS) as the main reactive agent. Alternatively, the cap layer can be formed by depositing silicon nitride using a chemical vapor deposition method with silicane or silicon dichlorohydride ($SiH_2Cl_2$) as the main reactive agent. Finally, a via opening is formed through the dielectric layer and the cap layer, and a second metallic line that couples electrically with the first metallic line through the via opening is formed.

20 Claims, 4 Drawing Sheets

U.S. PATENT DOCUMENTS

| | | | |
|---|---|---|---|
| 5,960,295 A | | 9/1999 | Jen et al. |
| 5,963,788 A | | 10/1999 | Barron et al. |
| 5,981,379 A | * | 11/1999 | Tsai .......................... 438/638 |
| 6,008,120 A | * | 12/1999 | Lee .......................... 438/634 |
| 6,077,784 A | | 6/2000 | Wu et al. |
| 6,083,851 A | * | 7/2000 | Shields et al. .............. 438/776 |
| 6,114,209 A | | 9/2000 | Chu et al. |
| 6,117,345 A | | 9/2000 | Liu et al. |
| 6,165,897 A | * | 12/2000 | Jang .......................... 438/637 |
| 6,174,808 B1 | * | 1/2001 | Jang et al. .................. 438/680 |
| 6,187,683 B1 | | 2/2001 | De Santi et al. |
| 6,191,028 B1 | | 2/2001 | Huang et al. |
| 6,197,681 B1 | * | 3/2001 | Liu et al. .................... 438/637 |
| 6,207,554 B1 | * | 3/2001 | Xu et al. .................... 438/624 |
| 6,376,259 B1 | * | 4/2002 | Chu et al. ...................... 438/3 |

* cited by examiner

CHEMICAL-MECHANICAL POLISHING METHOD

CROSS-REFERENCE TO RELATED APPLICATION

The present application is a continuation of U.S. patent application Ser. No. 09/563,030, filed May 1, 2009, now abandon which is a continuation of U.S. patent application Ser. No. 09/132,876, filed Aug. 11, 1998, now U.S. Pat. No. 6,077,784, which claims priority from Taiwan Application No. 87110514, filed Jun. 30, 1998, all the disclosures of which are herein specifically incorporated by this reference.

BACKGROUND OF THE INVENTION

1. Field of Invention

The present invention relates to a method of forming a metallic interconnect. More particularly, the present invention relates to a method of planarizing an inter-layer dielectric (ILD) layer or inter-metal dielectric (IMD) layer using a chemical-mechanical polishing (CMP) method.

2. Description of Related Art

In the fabrication of semiconductors such as very large scale integrated (VLSI) or ultra-large scale integrated (ULSI) circuits, usually two or more metallic layers are employed to interconnect semiconductor devices in different areas of a silicon chip. In general, inter-layer dielectric (ILD) or inter-metal dielectric (IMD) is used as an isolating material between metal lines in different layers. Therefore, as the design rules for forming semiconductor devices becomes highly restrictive due to miniaturization, the quality of the ILD or the IMD layer, such as its degree of surface planarity, is of growing importance.

In general, a high degree of surface planarity is an important factor in forming high-density devices using a photolithographic operation. Only a highly planar surface is capable of avoiding undesirable diffraction due to height difference during light exposure, so as to achieve a highly accurate pattern transfer. Planarization techniques can be categorized into two major groups, namely, a spin-on-glass (SOG) method and a chemical-mechanical polishing (CMP) method. However, when fabrication of semiconductors reaches the sub-half-micron stage, the spin-on-glass method is incapable of providing the degree of planarity necessary for high-quality production. Hence, the chemical-mechanical polishing method has become one of the principle means of global planarization in VLSI or ULSI production.

FIGS. 1A through 1D are cross-sectional views showing the progression of manufacturing steps in producing a metallic interconnect that uses chemical-mechanical polishing according to a conventional method. First, as shown in FIG. 1A, a semiconductor substrate 10 having an inter-layer dielectric (ILD) layer 12 thereon is provided. Then, a conductive line layer 14, for example, an aluminum layer or a polysilicon layer is formed over the ILD layer 12. Thereafter, an insulating layer 16 is formed by deposition over the ILD layer 12 and the conductive line layer 14. Preferably, the insulating layer 16 is formed using a high-density plasma chemical vapor deposition (HDPCVD) method. Due to the presence of the conductive lines 14 underneath, the insulating layer 16 has a pyramid-like cross-sectional profile 18 near its upper surface. In the subsequent step, an inter-metal dielectric (IMD) layer 19 is formed over the insulating layer 16.

Next, as shown in FIG. 1B, a chemical-mechanical polishing (CMP) operation is carried out to polish the IMD layer 19 so that a planar upper surface is obtained. Because a CMP method can easily lead to the over-polishing of the surface of the IMD layer 19 or the scratching of surface by polishing particles, micro-scratches will appear on the surface of the IMD layer 19. These micro-scratches vary in size and depth, and two such scratches 20a and 20b are shown in FIG. 1B.

Next, as shown in FIG. 1C, conventional photolithographic and etching operations are carried out to pattern the insulating layer 16. Consequently, an opening 22 through the insulating layer 16 and the IMD layer 19 is formed. The opening 22 exposes one of the conductive line layers 14 and subsequently will serve as a via.

Next, as shown in FIG. 1D, a metallic layer 26 is formed over the IMD layer 19 and inside the opening 22. Thereafter, photolithographic and etching operations are again carried out to pattern the metallic layer 26, thereby forming second metallic lines 26. Due to the presence of scratches (20a and 20b) on the surface of the IMD layer 19, metal will also be deposited into the scratches forming undesirable metallic scratch lines 24a and 24b.

The metallic scratch lines 24a and 24b can lead to a number of defects. FIG. 2 is a top view of a conventional metallic interconnect structure. In FIG. 2, first conductive lines 30, for example, an aluminum layer or a polysilicon layer, are formed over a semiconductor substrate (not shown in the figure). In addition, second conductive lines 32 are formed above the first conductive lines 30. Through a via opening 33, the first conductive line 30 is connected to the second conductive line 32. If the surface for forming the first conductive line 30 is over-polished and scratches are formed, metallic scratch lines such as the one labeled 34 in FIG. 2 will form. The metallic scratch line can form a bridge linking up neighboring second conductive lines, thereby causing short-circuiting.

In light of the foregoing, there is a need to improve the method of the chemical-mechanical polishing operation.

SUMMARY OF THE INVENTION

Accordingly, the present invention provides a chemical-mechanical polishing process to form a metallic interconnect that is capable of preventing the formation of micro-scratches due to over-polishing or scratching by polishing particles. Consequently, the method is capable of stopping undesirable short-circuiting or cross talks between metallic lines.

To achieve these and other advantages and in accordance with the purpose of the invention, as embodied and broadly described herein, the invention provides a chemical-mechanical polishing (CMP) process. The CMP process includes the steps of providing a semiconductor substrate having a first metallic line thereon, and then forming a first dielectric layer over the substrate and the first metallic line. The first dielectric layer can be a silicon dioxide layer formed using a high-density plasma chemical vapor deposition (HDPCVD) method. Thereafter, a second dielectric layer is formed over the first dielectric layer. The second dielectric layer can be a silicon dioxide layer formed using a plasma-enhanced chemical vapor deposition (PECVD) method. Next, a chemical-mechanical polishing (CMP) operation is carried out to polish the surface of the second dielectric layer. Subsequently, a thin cap layer is formed over the second dielectric layer, in one of several ways, including:

1. A plasma-enhanced chemical vapor deposition (PECVD) method, with silicane ($SiH_4$) as the main reactive agent, is used to form a silicon oxide layer having a thickness of about 1000–3000 Å, which can be adjusted according to the design rules.

2. A chemical vapor deposition (CVD) method, with tetra-ethyl-ortho-silicate (TEOS) as the main reactive agent, is used to form a silicon dioxide layer having a thickness of about 1000–3000 Å, which can be adjusted according to the design rules.

3. A chemical vapor deposition (CVD) method, with silicane ($SiH_4$) as the main reactive agent, is used to form a silicon nitride layer having a thickness of about 100–3000 Å, which can be adjusted according to the design rules.

4. A chemical vapor deposition (CVD) method, with silicon dichlorohydride ($SiH_2Cl_2$) as the main reactive agent, is used to form a silicon nitride layer having a thickness of about 100–3000 Å, which can be adjusted according to the design rules.

Thereafter, a via opening is formed through the first dielectric layer, the second dielectric layer and the cap layer, wherein the opening exposes the first metallic line. Finally, a second metallic line is formed over the cap layer and fills the interior of the via opening so that the second metallic line couples electrically with the first metallic line.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
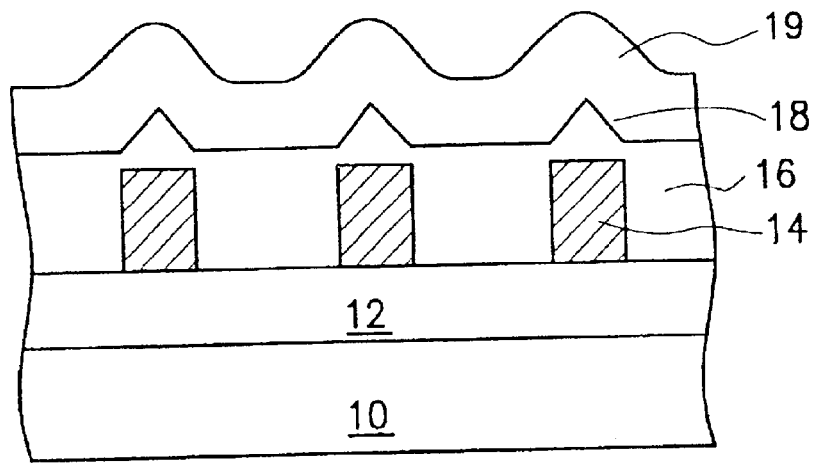
FIGS. 1A through 1D are cross-sectional views showing the progression of manufacturing steps in producing a metallic interconnect that uses chemical-mechanical polishing according to a conventional method.
Figure 1B:
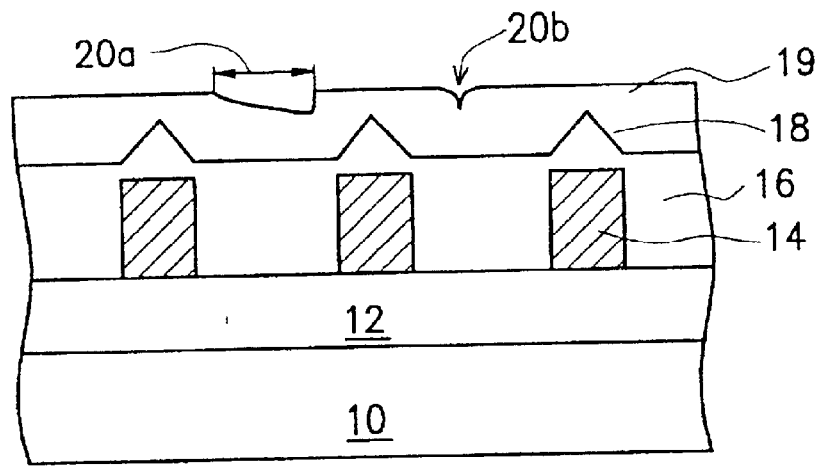
Figure 1C:
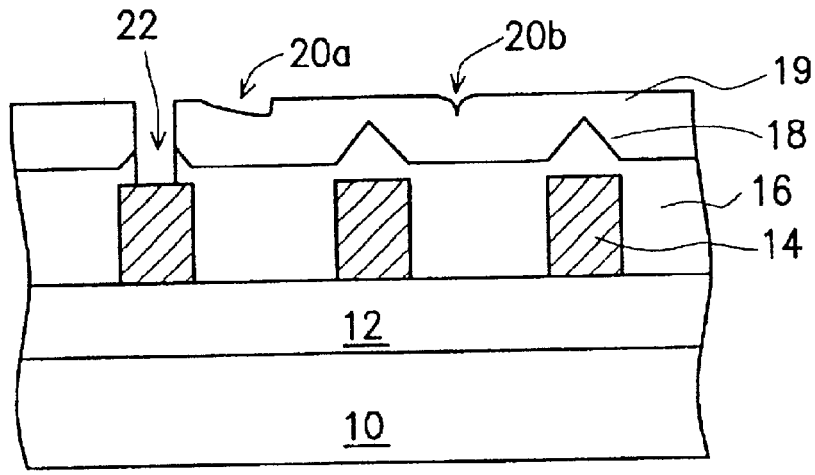
Figure 1D:
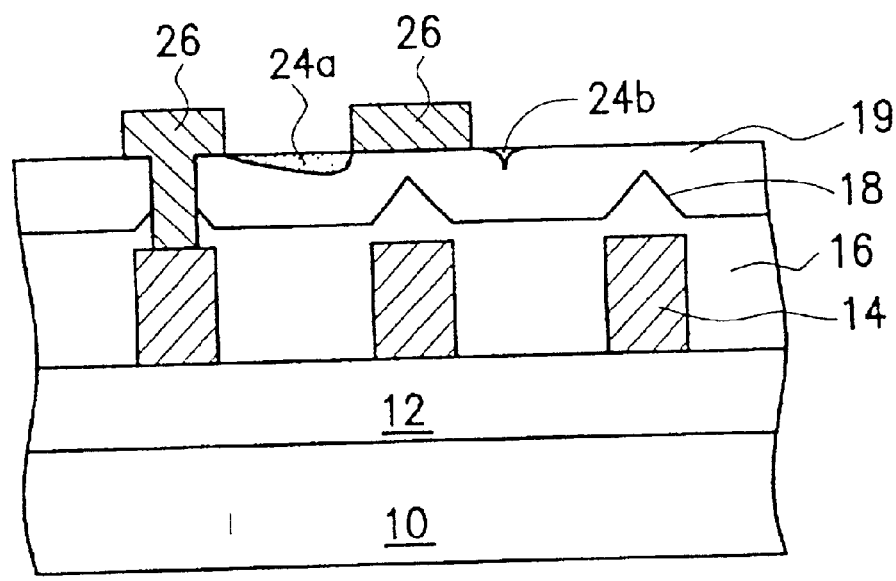
Figure 2:
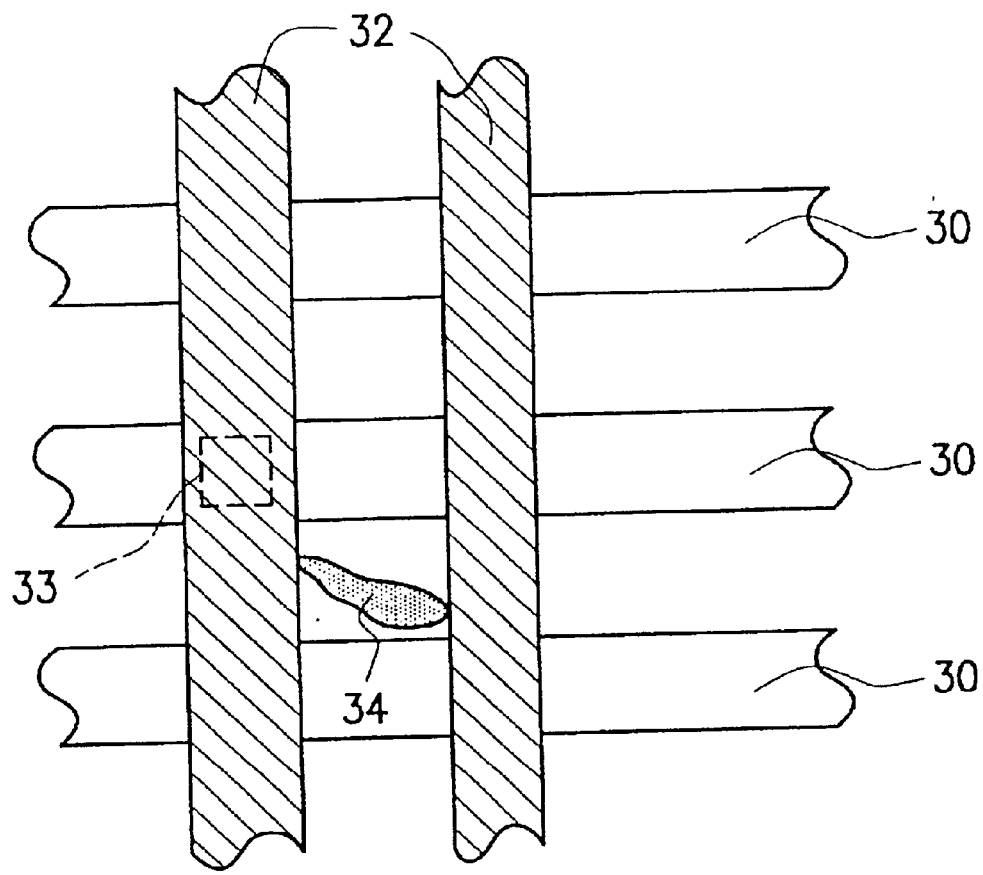
FIG. 2 is a top view showing a conventional metallic interconnect structure.

Reference will now be made in detail to the present preferred embodiments of the invention, examples of which are illustrated in the accompanying drawings. Wherever possible, the same reference numbers are used in the drawings and the description to refer to the same or like parts.

One major aspect of this invention is the coating of a cap layer over the dielectric layer after a chemical-mechanical polishing operation is applied to planarize the dielectric layer. Therefore, a higher degree of surface planarity can be obtained, and micro-scratches on the surface of the dielectric layer due to over-polishing or scratching by polishing particles can be eliminated. Consequently, short-circuiting between metallic lines due the presence of metallic scratch lines is prevented.

In general, high-density plasma chemical vapor deposition (HDPCVD) is a method that combines two basic operations. HDPCVD combines a chemical vapor deposition with an etching operation through physical bombardment by ions. High-density plasma serves to effect the ionization of reactive gases, whose kinetic energy and chemical potential is utilized to break chemical bonds and react with molecules on the surface of the semiconductor substrate. Therefore, a layer of the reactive material is able to deposit over and fill cavities on the semiconductor substrate.

On the other hand, the etching operation in HDPCVD is dependent upon the supply of gaseous argon. Physical bombardment by argon is what causes the formation of a 45° cut at the corners of a trench. Through reactive deposition and physical etching, HDPCVD is capable of controlling the deposition of material into micro-trenches of IMD layer, and hence voids are rarely formed. Therefore, HDPCVD is particularly suitable for use in the process of forming metallic interconnect.

Figure 3A:
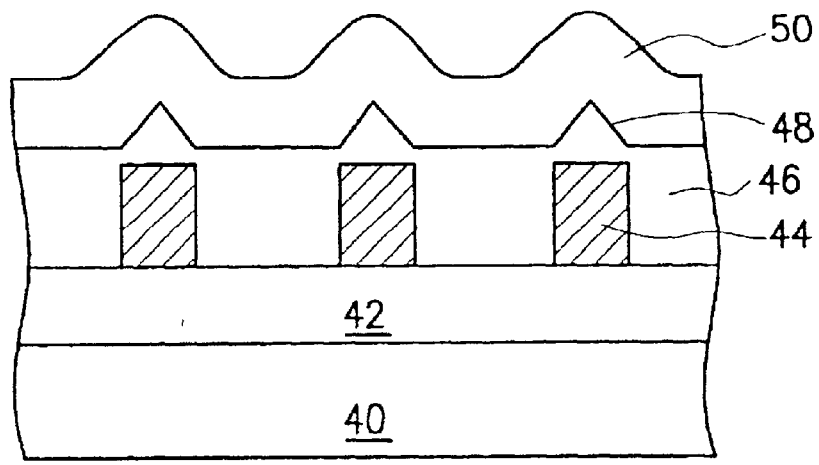
FIGS. 3A through 3E are cross-sectional views showing the progression of manufacturing steps in producing a metallic interconnect that uses chemical-mechanical polishing according to one preferred embodiment of this invention.

FIGS. 3A through 3E are cross-sectional views showing the progression of manufacturing steps in producing a metallic interconnect that uses chemical-mechanical polishing according to one preferred embodiment of this invention. First, as shown in FIG. 3A, a semiconductor substrate 40 is provided. Then, an inter-layer dielectric (ILD) layer 42 is formed over the substrate 40. In the subsequent step, first metallic lines 44, for example, aluminum or polysilicon layers are formed over the ILD layer 42. The first metallic lines 44 can be formed by depositing a metallic layer using, for example, a chemical vapor deposition method or a metal sputtering method.

Thereafter, the metallic layer is patterned to form the first metallic lines. Next, an insulating layer 46 and an inter-metal dielectric (IMD) layer 50 are formed above the ILD layer 42 and the first metallic lines 44. The insulating layer 46 is formed by depositing silicon dioxide over the ILD layer 42 and the first metallic lines 44 using, for example, a high-density plasma chemical vapor deposition (HDPCVD) method.

Due to the presence of the first metallic lines 44 and the characteristic of a HDPCVD deposition, a pyramid-like cross-sectional profile 48 having a height of about 10 KÅ is formed above each first metallic line 44. The IMD layer 50 is formed by depositing silicon dioxide or F-doped silicon oxide (FSG) to a thickness of about 20KÅ over the insulating layer 46 using, for example, a plasma-enhanced chemical vapor deposition (PECVD) method.

Figure 3B:
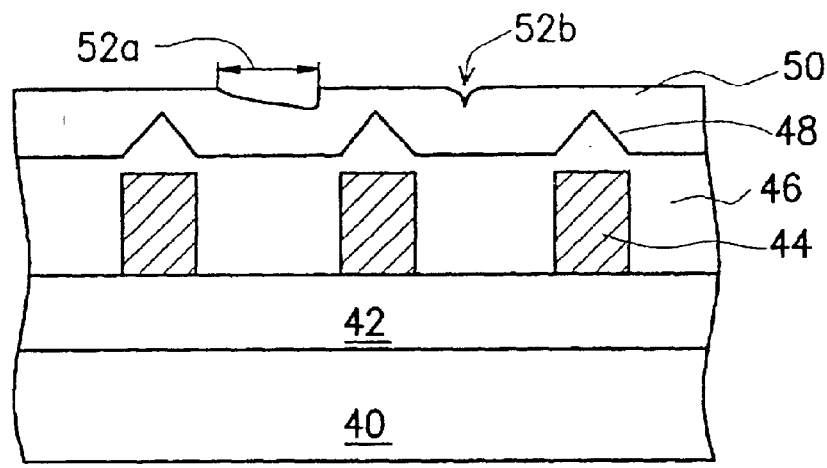

Next, as shown in FIG. 3B, the surface of the IMD layer 50 is planarized, preferably by polishing using, for example, a chemical-mechanical polishing (CMP) method. Because a CMP operation can easily lead to over-polishing of the surface of the IMD layer 50 or the scratching of the surface by polishing particles, micro-scratches will appear on the surface of the IMD layer 50. These micro-scratches vary in size and depth, and two such scratches labeled 52a and 52b are shown in FIG. 3B.

Figure 3C:
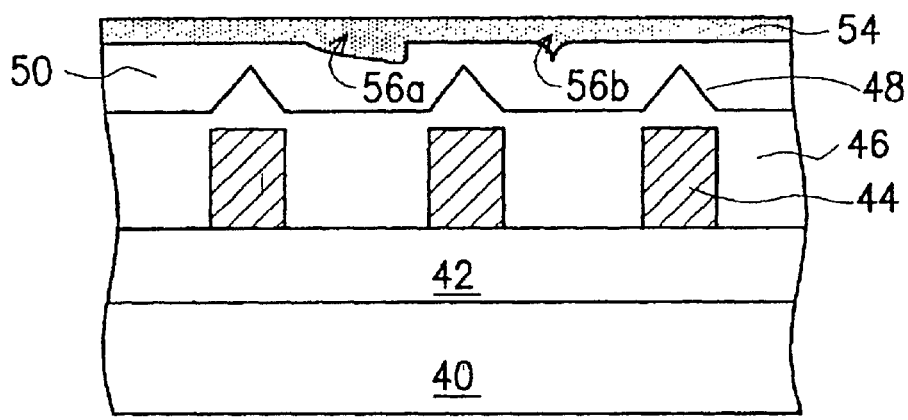

Next, as shown in FIG. 3C, a cap layer 54 is formed over the IMD layer 50 so that the micro-scratches 52a and 52b are covered. Hence, insulated scratches 56a and 56b are formed. The cap layer 54 preferably having a thickness of between 1000 Å to 3000 Å can be made from material including, for example, silicon dioxide, phosphosilicate glass (PSG) or silicon-rich oxide (SRO). Moreover, the thickness of the cap layer 54 can be adjusted according to the design rule. The cap layer represents a major aspect of this invention that can be formed in several ways including: (1) using silicane ($SiH_4$) as the main reactive agent, a plasma-enhanced chemical vapor deposition (PECVD) method is used to form a silicon oxide layer; or (2) using tetra-ethyl-ortho-silicate (TEOS) as the main reactive agent, a chemical vapor deposition (CVD) method is used to form a silicon dioxide layer; or (3) using silicane ($SiH_4$) as the main reactive agent, a chemical vapor deposition (CVD) method is used to form a silicon nitride layer; or (4) using silicon dichlorohydride ($SiH_2Cl_2$) as the main reactive agent, a chemical vapor deposition (CVD) method is used to form a silicon nitride layer.

Figure 3D:
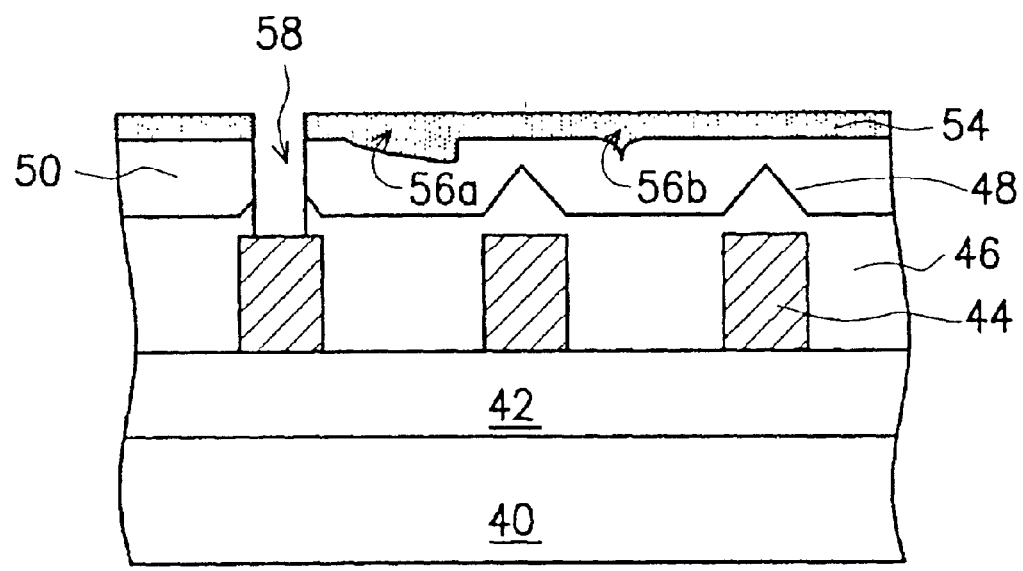

Next, as shown in FIG. 3D, conventional photolithographic and etching operations are carried out to form an opening 58 through the insulating layer 46, the IMD layer 50 and the cap layer 54. The opening 58 exposes one of the first metallic lines 44 and subsequently will serve as a via.

Figure 3E:
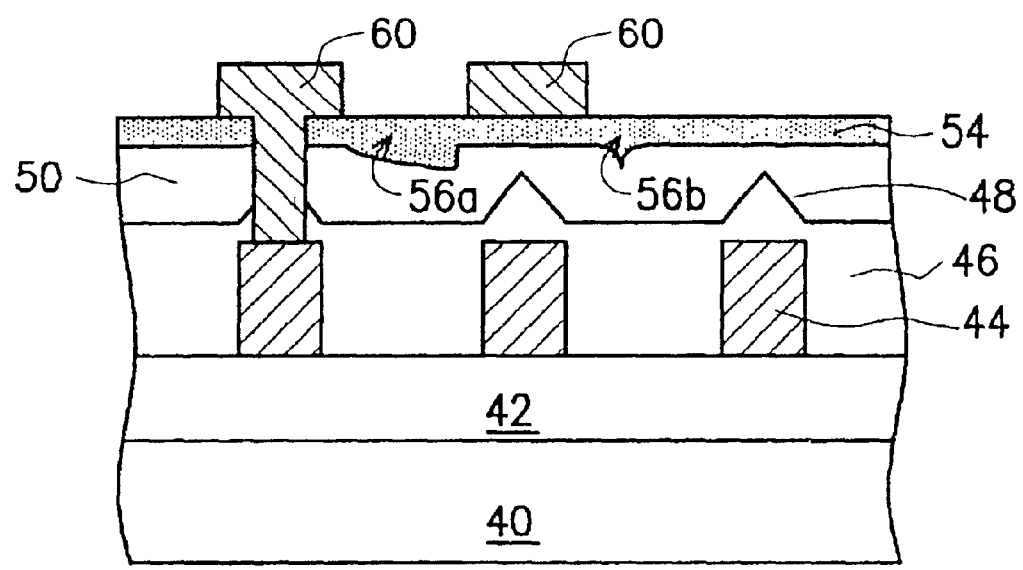

Next, as shown in FIG. 3E, metallic material, for example, tungsten or other conductive material is deposited over the cap layer and into the opening 58. Thereafter, photolithographic and etching operations are again carried out to pattern the metallic layer, thereby forming second metallic lines 60. Consequently, a metallic interconnect structure is formed.

In summary, the advantages of using the chemical-mechanical polishing process of this invention to fabricate metallic interconnect includes:

1. A higher quality of polished surface is obtained by eliminating micro-scratches on a polished surface due to over-polishing or scratching by polishing particles.
2. The polishing process used in this invention is capable of preventing the formation of metallic scratch lines, thereby eliminating possible short-circuiting pathways between subsequently formed metallic lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chemical mechanical polishing process, comprising the steps of:
   (a) forming a conductive layer over a semiconductor substrate; and
   (b) patterning said conductive layer to form interconnect lines;
   (c) forming at least one dielectric layer over said interconnect lines, said at least one dielectric layer having a first thickness;
   (d) polishing said at least one dielectric layer to form a planar surface; and
   (e) forming a thin cap layer over said planar surface, said thin cap layer having a second thickness which is sufficient to fill scratches formed in said at least one dielectric layer during said polishing step (d), and which second thickness is substantially less than said first thickness.

2. The method of claim 1 wherein said first thickness is about 20K Angstroms to 30K Angstroms, and said second thickness is about 1K to 3K Angstroms.

3. The method of claim 1, wherein said first thickness is about ten times greater than said second thickness.

4. The method of claim 1, wherein said cap layer prevents metal bridges from forming in said scratches of said at least one dielectric layer.

5. The method of claim 1, wherein said at least one dielectric layer includes a fluorinated silicon glass (FSG) layer.

6. The method of claim 1, wherein said at least one dielectric layer further includes a high density plasma chemical vapor deposition layer formed between and over said interconnect lines.

7. The method of claim 1, wherein said cap layer includes silicon oxide, silicon nitride, phosphosilicate glass (PSG), and/or silicon-rich oxide.

8. The method of claim 1, wherein said conductive layer includes doped polysilicon.

9. The method of claim 1, wherein said cap layer provides a higher degree of surface planarity than said planar surface, and further forms a highly planar surface that can reduce undesirable diffractions from height differences so that during a subsequent photolithographic operation undesirable diffractions from height differences are reduced.

10. The method of claim 1, wherein said further including the steps of:
   patterning said cap layer and said at least one dielectric layer to form openings to said conductive layer;
   forming an additional conductive layer over said cap layer and in said openings, such that conductive vias are formed between said conductive layer and said additional conductive layer;
   patterning said additional conductive layer to form additional interconnects over said cap layer.

11. A chemical mechanical polishing process, comprising the steps of:
   (a) forming a conductive layer over a semiconductor substrate;
   (b) patterning said conductive layer to form interconnect lines;
   (c) forming at least one dielectric layer over said interconnect lines, said at least one dielectric layer having a first thickness;
   (d) polishing said at least one dielectric layer to form a polished surface; and
   (e) forming a thin cap layer over said polished surface and which is sufficient to fill scratches formed in said at least one dielectric layer and thus to planarize said polished surface, said thin cap layer having a second thickness which is substantially less than said first thickness.

12. The method of claim 11, wherein said first thickness is about 20K Angstroms to 30K Angstroms, and said second thickness is about 1K to 3K Angstroms.

13. The method of claim 11, wherein said first thickness is about ten times greater than said second thickness.

14. The method of claim 11, wherein said cap layer prevents metal bridges from forming in said scratches of said at least one dielectric layer.

15. The method of claim 11, wherein said at least one dielectric layer includes a fluorinated silicon glass (FSG) layer.

16. The method of claim 11, wherein said at least one dielectric layer further includes a high density plasma chemical vapor deposition layer formed between and over said interconnect lines.

17. The method of claim 11, wherein said cap layer includes silicon oxide, silicon nitride, phosphosilicate glass (PSG), and/or silicon-rich oxide.

18. The method of claim 11, wherein said conductive layer includes doped polysilicon.

19. The method of claim 11, wherein said cap layer provides a higher degree of surface planarity than said planar surface, and further forms a highly planar surface that can reduce undesirable diffractions from height differences so that during a subsequent photolithographic operation undesirable diffractions from height differences are reduced.

20. The method of claim 11, wherein said further including the steps of:

patterning said cap layer and said at least one dielectric layer to form openings to said conductive layer;

forming an additional conductive layer over said cap layer and in said openings, such that conductive vias are formed between said conductive layer and said additional conductive layer;

patterning said additional conductive layer to form additional interconnects over said cap layer.

* * * * *